United States Patent [19]

Smith et al.

[11] Patent Number: 4,870,224
[45] Date of Patent: Sep. 26, 1989

[54] INTEGRATED CIRCUIT PACKAGE FOR SURFACE MOUNT TECHNOLOGY

[75] Inventors: William D. Smith, Fremont, Calif.; Richard Dennis, Ettons, Pa.; Nicholas Brathwaite, Sunnyvale; Richard C. Blish, II, Saratoga, both of Calif.

[73] Assignee: Intel Corporation, Santa Clara, Calif.

[21] Appl. No.: 214,219

[22] Filed: Jul. 1, 1988

[51] Int. Cl.⁴ .................................................. H01L 23/28
[52] U.S. Cl. ..................................... 174/52.4; 29/827
[58] Field of Search .............. 174/52 FP; 357/72, 74; 29/827, 841, 855

[56] References Cited

U.S. PATENT DOCUMENTS

| | | | |
|---|---|---|---|
| 3,401,055 | 9/1968 | Langdon et al. | 117/212 |
| 3,401,126 | 9/1968 | Miller et al. | 252/514 |
| 3,414,417 | 12/1968 | Miller | 106/26 |
| 3,429,040 | 2/1969 | Miller | 29/626 |
| 3,469,148 | 9/1969 | Lund | 174/52 FP |
| 3,469,684 | 9/1969 | Keady et al. | 174/52 FP X |
| 3,544,857 | 12/1970 | Byrne et al. | 174/52 FP X |
| 4,214,120 | 7/1980 | Jones, Jr. et al. | 174/52 FP |
| 4,258,382 | 3/1981 | Harris | 357/71 |
| 4,387,413 | 1/1988 | Griffis | |
| 4,427,715 | 1/1984 | Harris | 427/96 |
| 4,477,827 | 10/1984 | Walker et al. | 357/70 |
| 4,480,148 | 10/1984 | Archer | 174/52 FP X |
| 4,766,478 | 8/1988 | Dennis | |

OTHER PUBLICATIONS

T. Ozawa, et al., "Micro Hybrid Circuits for Surface Mounting Technology", IEEE pp. 10–15, 1986.

Primary Examiner—R. L. Moses
Assistant Examiner—D. A. Tone
Attorney, Agent, or Firm—Blakely, Sokoloff, Taylor & Zafman

[57] ABSTRACT

The present invention provides for an apparatus and a method for housing an integrated circuit device. The integrated circuit device is coupled to a ceramic substrate wherein contacts of the integrated circuit device mate with contacts on the substrate surface. Conductive lines then couple the contacts to the peripheral edges of the substrate where one set of ends of a lead frame assembly mates with the conductors. An encapsulation technique is used to encapsulate the device, such that only the other set of ends of the lead frame assembly extends from the package. In an alternative embodiment, the integrated circuit is hermetically sealed by having a hermetic cover disposed over the integrated circuit. In a second alternative embodiment, the substrate is capable of having disposed upon it multiple integrated circuits. The present invention provides for a significant increase of lead count to die size ratio.

20 Claims, 5 Drawing Sheets

FIG_1 (PRIOR ART)
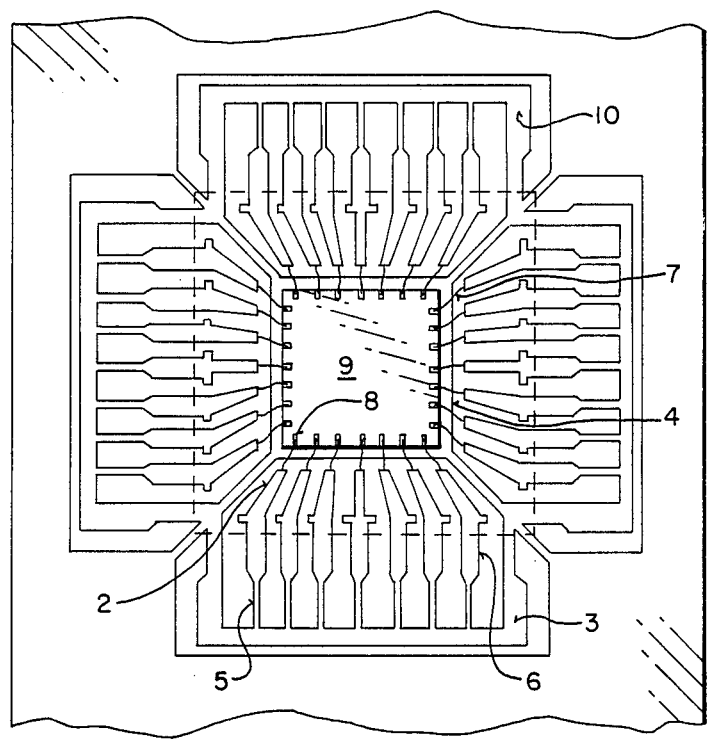
FIG_2
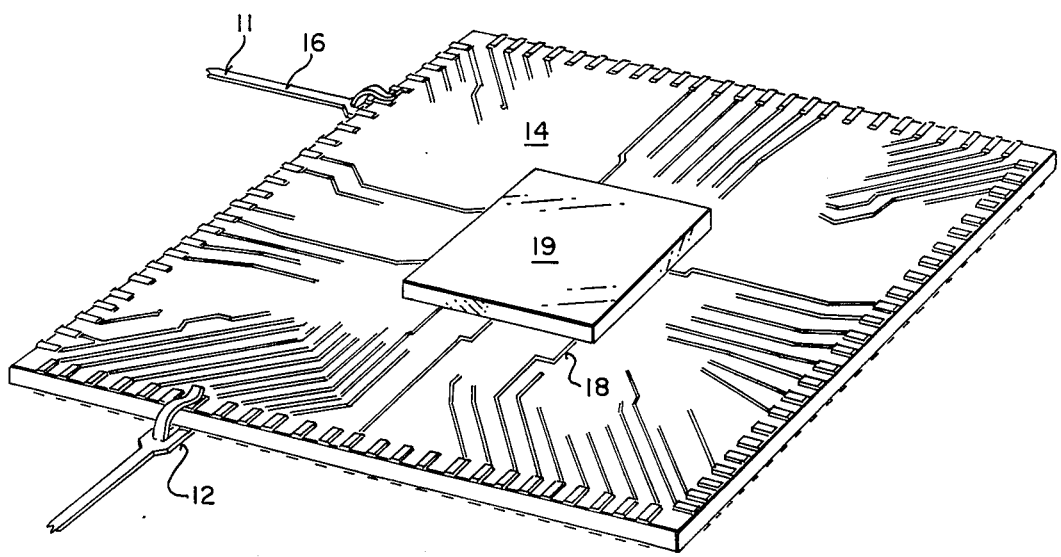

FIG_3
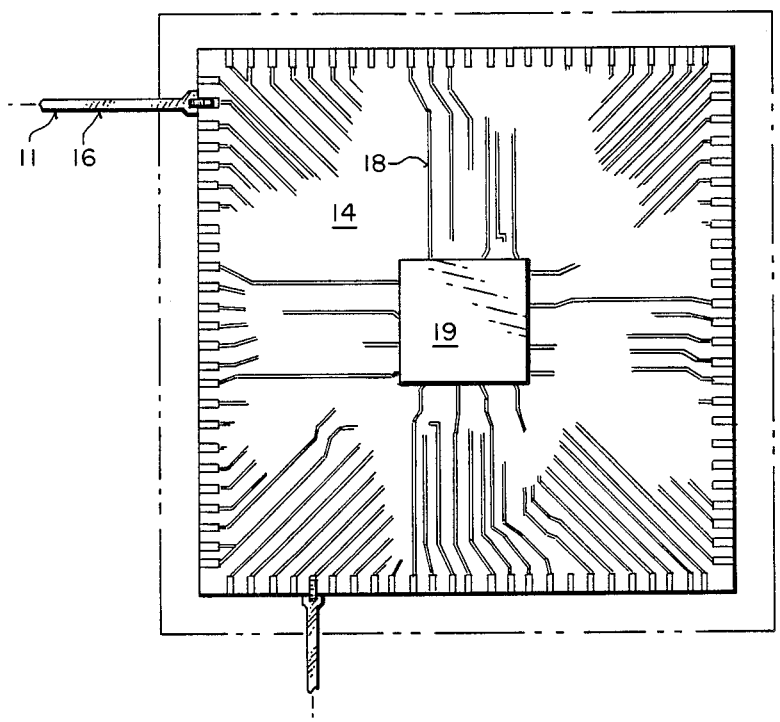
FIG_4
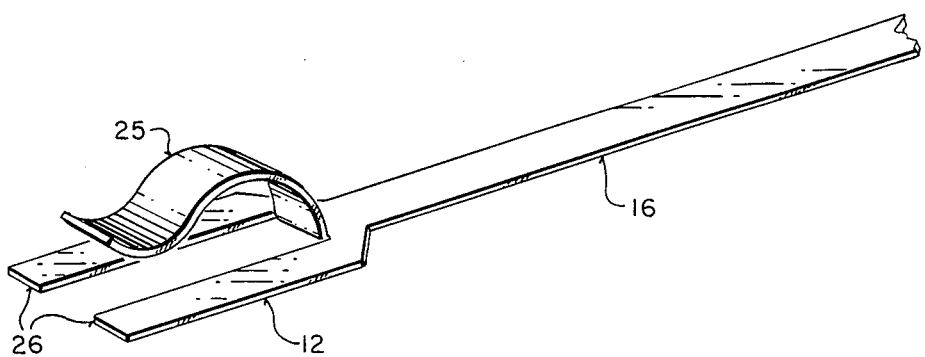
FIG_5
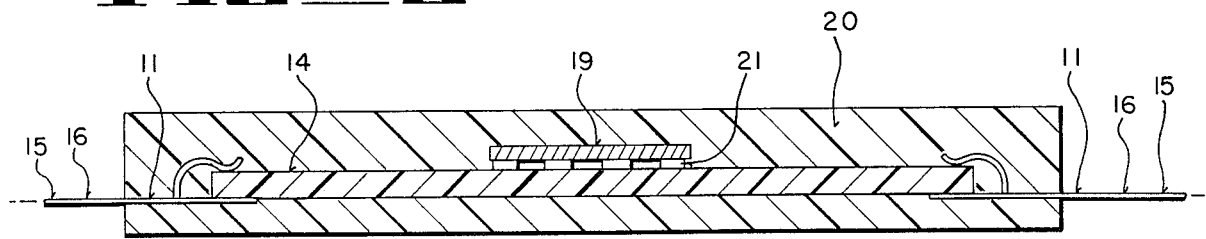

FIG_6
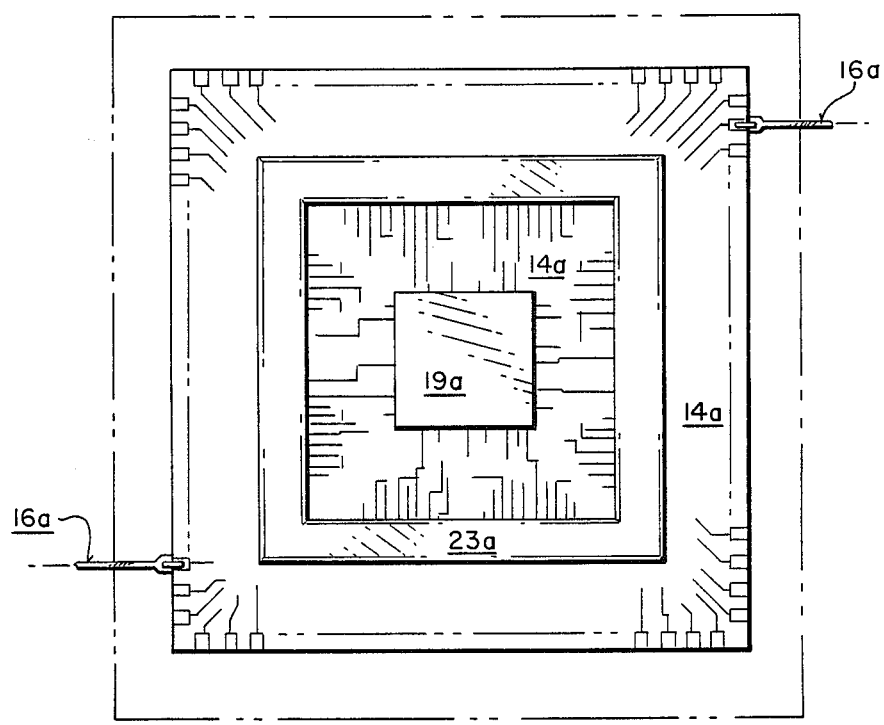
FIG_7
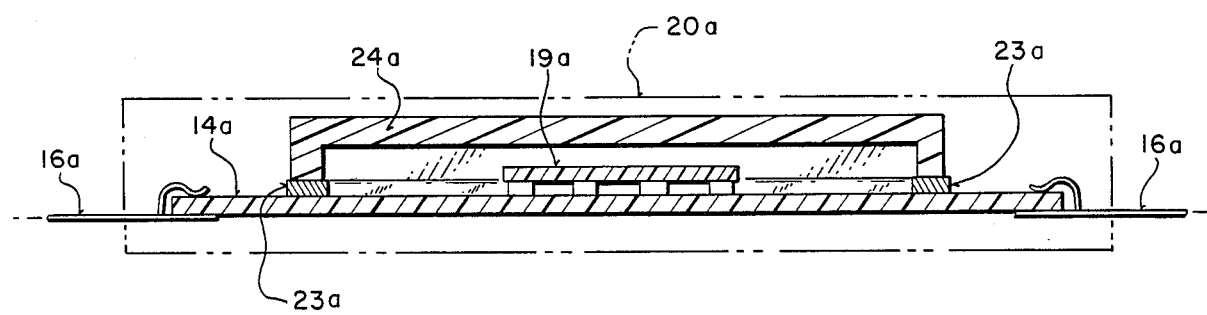

FIG_8
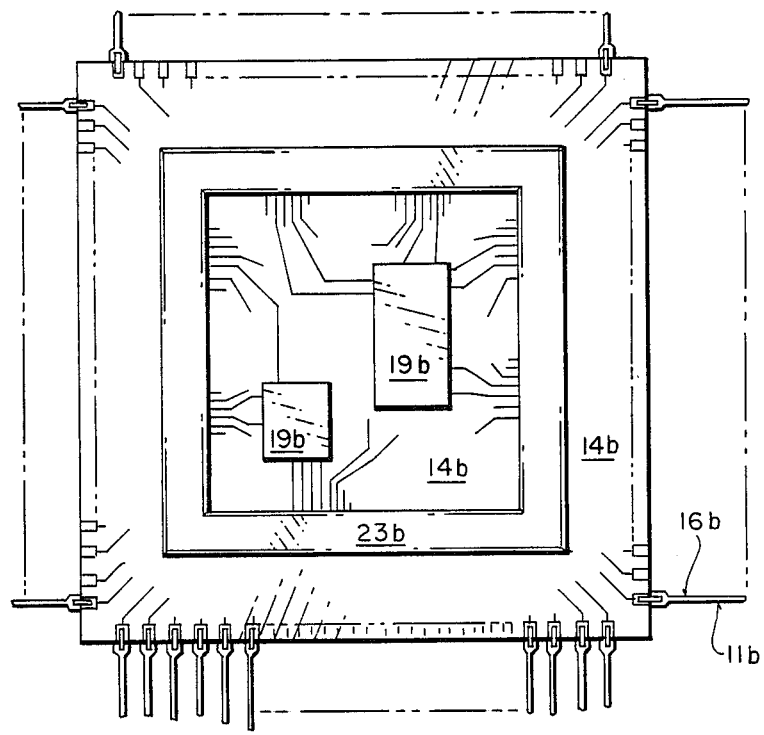
FIG_9
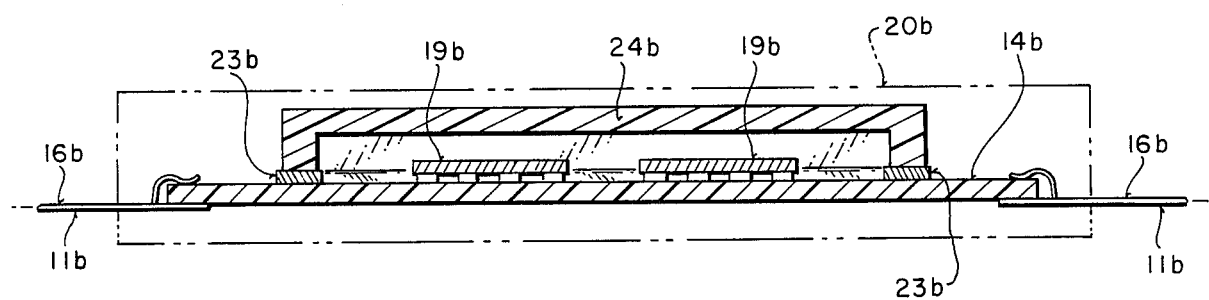

FIG_10
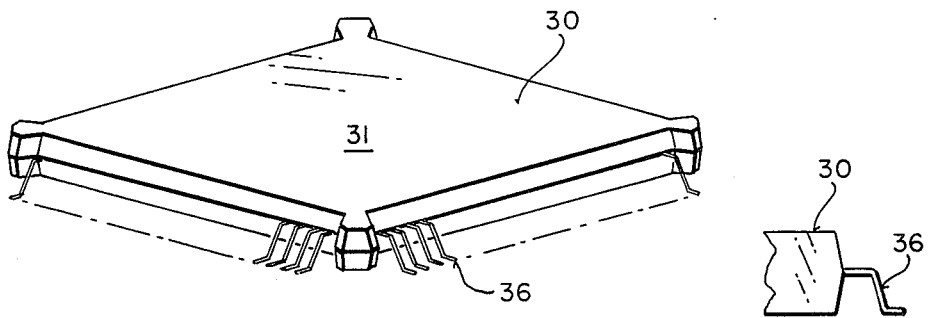
FIG_11
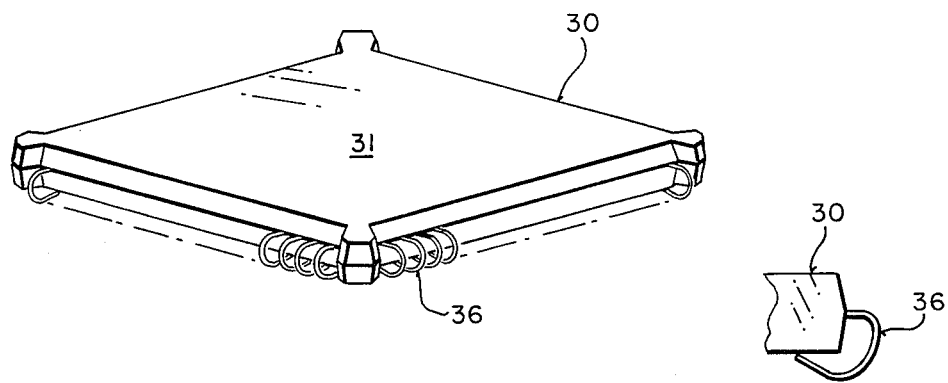
FIG_12
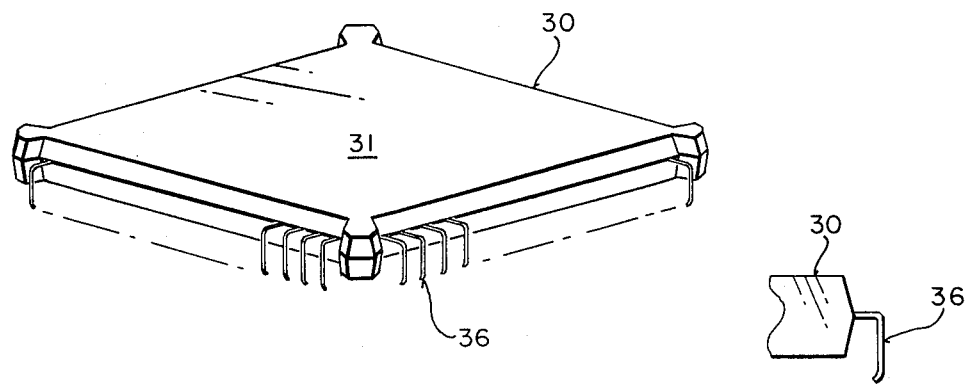

INTEGRATED CIRCUIT PACKAGE FOR SURFACE MOUNT TECHNOLOGY

BACKGROUND OF THE INVENTION

1. Field of the Invention

The present invention relates to the field of packaging integrated circuits and more specifically for use in surface mounting technology.

2. Prior Art

Various semiconductor housing structures and techniques are known in the prior art. In the packaging of integrated circuits, a die which comprises the integrated circuits is mounted onto a base wherein contact points face upward so that these contacts are exposed. A lead frame is utilized to provide the electrical coupling to the integrated circuit. Typically, the lead frame assembly is planar in construction and surrounds the die element. In some instances the lead frame forms the base upon which the die is disposed. The die contacts are coupled to the lead frame by wires or conducting tapes. Then, the whole assembly is encapsulated using a known encapsulating technique. These encapsulating techniques include the use of plastics and ceramics. Where hermetic sealing is desired, specialized encapsulation techniques are utilized. The lead ends of the lead frame are then formed to extend beyond the encapsulation, such that these leads provide the electrical coupling of the die to the external environment.

Integrated circuit packages are provided in a number of industry standard configurations. These include dual-in-line (DIP), pin grid array (PGA) and flat-pack packages. Then, the package is typically mounted onto a printed circuit board by known techniques. These techniques include inserting the leads into holes provided on the printed circuit board or, alternatively, the leads can have a surface mounting configuration where the leads do not extend into the circuit board.

A problem with the prior art packaging technique is the time and difficulty involved in precisely bonding lead wires from the integrated circuit to the lead frame. Lead count to die size ratio for of the package is a limiting factor with prior art techniques. Further, because the prior art techniques utilize a lead frame which surrounds the integrated circuit and lead wires are coupled to the ends of the lead frame, it is difficult or impossible, in some instances, to place multiple integrated circuit dies using a single lead frame assembly.

It is appreciated then that what is required is an integrated circuit packaging technique that is capable of housing an integrated circuit more efficiently and reliably then the prior art technique. Further, it is appreciated that a packaging technique which permits multiple integrated circuits to be housed in a singular package or provides a small die with a high lead count is needed.

SUMMARY OF THE PRESENT INVENTION

The present invention describes a package for housing one or a plurality of integrated circuits (IC). The IC is coupled to a ceramic substrate, wherein terminal contacts of the IC mate with electrical contact points on the surface of the substrate. Conductive lines are disposed throughout the substrate to couple these contacts to the peripheral edges of the substrate. One end of a lead frame assembly mates with the conductive lines at the edges of the substrate. The substrate mating end of each lead is comprised of a finger like projection wherein the substrate is disposed between one upper finger and two lower fingers of the lead end.

In the preferred embodiment, the above-described device is encapsulated in epoxy or molded plastic to provide isolation integrity. In an alternative embodiment, a seal ring is formed on the surface of the substrate forming an enclosed perimeter about the IC and a hermetically sealing lid is placed on the seal ring to completely enclose the IC to provide a hermetically sealed enclosure. Although further encapsulation is not essential, the entire substrate can be encapsulated such that only the leads extend externally of the encapsulation. In a second alternative embodiment, multiple integrated circuits are mounted onto the substrate using one of the above two techniques. Then, for the various embodiments the external ends of the leads are shaped to provide for surface mounting of the package.

The technique of the present invention permits for a simpler and more efficient method of housing integrated circuits, provide for increased lead count to die size ratio and allow for housing of multiple integrated circuits in standard surface mountable package configuration.

BRIEF DESCRIPTION OF THE DRAWINGS

FIG. 1 shows a prior art technique of coupling an integrated circuit to a lead frame assembly by the use of lead wires.

FIG. 2 shows a technique of the present invention wherein an integrated circuit is electrically coupled onto a substrate and wherein a lead frame is coupled to the substrate.

FIG. 3 is a top plan view of the packaging technique shown in FIG. 2.

FIG. 4 is a perspective view showing a substrate end of a lead used with the lead frame assembly of the preferred embodiment.

FIG. 5 is a cross-sectional view showing a structure of the preferred embodiment.

FIG. 6 is a top plan view of an alternative embodiment showing the mounting of an integrated circuit onto a substrate which includes a seal ring for providing a hermetic seal.

FIG. 7 is a cross-sectional view of the alternative embodiment of the present invention which hermetically seals the integrated circuit.

FIG. 8 is a top plan view of a second alternative embodiment showing a placement of multiple integrated circuits onto a substrate which also provides a seal ring.

FIG. 9 is a cross-sectional view of the second alternative embodiment showing the use of a hermetic seal.

FIG. 10 is a perspective view showing a completed package having gull-wing shaped external lead ends for surface mounting.

FIG. 11 is a perspective view showing a completed package having J-bend shaped external lead ends for surface mounting.

FIG. 12 is a perspective view showing a completed package having stud shaped external lead ends for surface mounting.

DETAILED DESCRIPTION OF THE INVENTION

The present invention describes an apparatus and a method for housing integrated circuits. In the following description, numerous specific details are set forth in order to provide a thorough understanding of the present invention. It will be obvious, however, to one skilled in the art that the present invention may be practiced without these specific details. In other instances well-known methods and structures have not been described in detail so as not to unnecessarily obscure the present invention.

PRIOR ART

Referring to FIG. 1, one widely used prior art technique for housing an integrated circuit (IC) and coupling the integrated circuit to a lead frame assembly is shown. In this prior art technique, a lead frame 10 having a plurality of leads 6 is utilized. Lead frame assembly 10 typically includes a base 4, sometimes referred to as a flag, die attach pad or paddle. An integrated circuit 9 is placed on the paddle 4 so that contacts 8 of IC 9 face upward and are exposed. Then, bonding wires 7 are used to electrically couple the contacts 8 of the IC 9 to the lead frame 10. Contact (inner) ends 2 of each of the leads 6 of the lead frame 10 are coupled to corresponding contacts 8 by wires 7. Wires 7 are bonded by various known techniques, one technique being welding.

In some instances a tape automated bonding technique is used to provide the coupling between contact ends 2 and contacts 8. The leads 6 have external (outer) ends 5, which typically are connected together by a frame 3 portion of the lead frame 10. The frame 3 is eventually detached to form individual leads extending externally from a package when IC 9 and portions of leads 6 are encapsulated.

It is to be appreciated that FIG. 1 describes one prior art technique and that numerous other prior art techniques are available to package an IC. Further the drawing of FIG. 1 is for illustrative purpose only and that other variations are known, such as the placement of contacts 8 upon the IC 9 surface need not be only at the edges of the IC 9, as is shown in FIG. 1.

PRESENT INVENTION

Referring to FIGS. 2 and 3, they show a structure of the present invention wherein an integrated circuit 19 is mounted onto a substrate 14 and a lead frame 11 having a plurality of leads 16 is coupled to the substrate 14 instead of directly to the IC 19. The IC 19 can be of a variety of integrated circuit devices, including processors and memories. IC 19 is typically in a form known as a die. As practiced in the preferred embodiment, substrate 14 is substantially a flat device. Substrate 14 is fabricated from a dielectric material, and in the preferred embodiment the material is alumina ceramic. Upon a surface of the substrate 14, or embedded within the substrate 14, are conductive lines 18 which run from the edge of the substrate 14 to the interior portion of substrate 14. The conductive lines 18 form contacts at the edges of substrate 14 for mating with a lead frame 11. For simplicity of illustration, only two leads 16 are shown in FIGS. 2 and 3; but it is understood that many leads 16 are used to couple to the conductive lines 18 and, also, the leads are coupled together in a frame assembly to form a lead frame 11.

The IC 19 is then mounted onto substrate 14 such that contacts (see reference 8 in FIG. 1) face and mate with substrate 14. That is, the IC "chip" is flipped over so that the contacts of the IC 19 face downward to mate to the conductive lines 18 present on substrate 14. The electrical contact is achieved by the conductive lines 18 coupling the IC contacts to the edge of the substrate 14. A number of techniques are available to affix IC 19 onto substrate 14 and to provide the electrical coupling of the IC contacts to corresponding conductive lines 18 in or on the substrate 14. One such technique is disclosed in U.S. Pat. No. 3,429,040.

As used in the preferred embodiment the conductive lines 18 of the substrate 14 and the respective contact points of IC 19 are soldered. Because the non-contact portions of IC 19 and substrate 14 are non-wettable by solder, the surface tension of melted solder causes only the wettable areas of the IC 19 to self-align to the contact points on the substrate 14. Thus, by this self-aligning solder technique, IC 19 contacts align and attach to the substrate 14 contact points to form a physical and electrical coupling. Further, non-wettable regions of the substrate around the contacts assure that undesirable cross-coupling will not occur.

Although the preferred embodiment uses alumina ceramic as the composition of the material of substrate 14, a variety of other dielectric materials can be used for substrate 14. These materials include aluminum nitride, a polymer, mullite, or oxidized silicon. An advantage of using oxidized silicon is that the thermal coefficient of the integrated circuit die, which is typically comprised of silicon, is so closely related in composition that thermal coefficient matching occurs.

Then the lead frame 11 is coupled to the substrate 14. Substrate (inner) end 12 of each lead 16 of the lead frame 11 are coupled to the edge of the substrate 14 to mate to corresponding conductive lines 18.

FIG. 4 shows an enlargement of one of the leads 16. The substrate end 12 of the lead 16 is comprised of an upper finger 25 and two lower fingers 26 wherein substrate 14 is disposed between the upper and lower fingers 25 and 26, respectively. Once the substrate 14 is disposed completely within all of the fingers forming the leads 16 of lead frame 11, the fingers 25 and 26 are crimped to substrate 14.

A solder bond ensures a permanent electrical and physical coupling of the fingers 25 and 26 to the conductive lines 18 of substrate 14. Again, non-wettable regions of the substrate around the contacts prevent cross coupling to occur. The step of soldering the leads 16 to the substrate 14 can be combined with the bonding of the IC 19 onto the substrate in a single step. It is to be appreciated that although a specific three finger lead frame end is shown in FIG. 4, other configurations which couple the lead 16 to the substrate 14 can be used without departing from the spirit and scope of the present invention.

Referring to FIG. 5, a cross-sectional view of the device of the present invention is shown. IC 19 resides upon substrate 14 making contact 21 and the edges of the substrate 14 are coupled to leads 16. Then IC 19, substrate 14 and portions of leads 16 of lead frame 11 are encapsulated using one of a variety of materials well suited for encapsulation of integrated circuits. Such materials being well known in the prior art. The preferred embodiment uses molded epoxy or other plastics to form molding 20 to provide isolation integrity of IC 9. The external (outer) ends 15 of leads 16 extend past the edges of the molding 20 to provide the electrical coupling of the IC 19 to the external environment. The ends 15 are separated from the lead frame 11 to form individual leads. With the use of a four sided lead frame, as is shown in FIGS. 2 and 3, the lead ends 15 extend out from all four sides of the molding 20. Then the lead ends 15 are formed for mounting.

Referring to FIGS. 6 and 7, an alternative embodiment is shown wherein the integrated circuit 19a is hermetically sealed. IC 19a, substrate 14a and leads 16a are equivalent to corresponding reference numerals in FIGS. 2, 3 and 5, but have a letter "a" as a suffix. In the alternative embodiment IC 19a resides within the enclosed perimeter formed by seal ring 23a. Seal ring 23a resides on a surface of the substrate 14a and provides a raised and enclosing perimeter upon substrate 14a. The seal ring 23a of the present invention is comprised of a metal or a metal alloy for the purpose of providing a base for a cover which is used to hermetically seal IC 19a. Other materials, such as low temperature glass, high strength organic materials can also be used.

The attachment of IC 19a and leads 16a of lead frame 11a to substrate 14a uses the procedure and technique described above in reference to the preferred embodiment. Once the IC 19a has been attached to the substrate 14a, a lid 24a is placed over the IC 19a, such that the lid 24a rests upon the seal ring 23a. A variety of materials used to hermetically seal integrated circuits can be used for lid 24a. Such materials are formed from a metal or metal alloy, glass, ceramic or metal coated plastic. The alternative embodiment uses ceramic material to form lid 24a. Lid 24a is bonded to seal ring 23a by use of a sealing process which typically comprises of electrical heating, adhesive, welding, reflow solder or glass. Once the lid 24a is bonded onto seal ring 23a, the IC 19a is totally enclosed within the containment formed by lid 24a, seal ring 23a and substrate 14a, such that the IC 19a is hermetically sealed. Then, the leads are separated and formed for mounting. Because the hermetic seal provides isolation integrity, encapsulation is not necessary. However, encapsulation can be used for compatibility with standardized structures and such encapsulation 20a is shown in FIG. 7. One advantage of standardized packages is in the ease of using a particular equipment, such as a handling jig, shipping containers etc.

Referring to FIGS. 8 and 9, a second alternative embodiment showing the packaging of multiple integrated circuits into a single package using the technique of the present invention is shown. ICs 19b are mounted onto substrate 14b and the edges of the substrate are coupled to the various leads 16b of lead frame 11b. Elements having reference numerals in FIGS. 8 and 9 are equivalent to that of earlier described elements having the same designation in the other Figures, except here a letter "b" is used as a suffix. It is to be appreciated that substrate 14b of FIGS. 8 and 9 has a seal ring 23b upon which lid 24b is placed to hermetically seal ICs 19b. However, it is to be appreciated that the multiple integrated circuit packaging technique can be used without the use of seal ring 23b and lid 24b. The technique of FIGS. 2, 3 and 5 can also be used to encapsulate multiple ICs 19b. Encapsulation 20b is shown in FIG. 9, however, such encapsulation 20b is not required when ICs 19 are hermetically sealed. Further, only two ICs 19b are shown in FIGS. 8 and 9, but the actual number is a design choice.

With the practice of the present invention, bonding wires or tapes are not required to couple the contacts of the integrated circuit to the various lead frame terminals. Therefore, cross coupling connections from the lead frame to the integrated circuit are alleviated and inductance is minimized because with the present invention, the conductors reside on or in the substrate. The present invention simplifies and provides for a more efficient technique of packaging an IC over prior art techniques. Further, with the practice of the present invention, lead densities (number of leads per unit area of die) can be increased over prior art techniques. With outer leads spaced at 25 mils, 300+ leads can now be provided in standard encapsulated flat IC packages. A much smaller die can be accommodated than the prior art.

Referring to FIGS. 10–12, the integrated circuit device of the preferred embodiment and the alternative embodiments, if and once encapsulated, will have the leads 36 extending outside of the molding 30. Molding 30 is equivalent to the encapsulation 20, 20a-b, of the earlier Figures. The leads are formed to provide a gullwing, J-bend and stud lead, as shown in FIGS. 10, 11 and 12, respectively, for surface mounting the molded integrated package 31. It is to be appreciated that the purpose of the lead ends shown in FIGS. 10–12 is for illustrative purpose only and is not to limit the present invention. Further, it is the intent of the present invention to surface mount the package, however, other prior art techniques can be used to mount integrated circuit package 31. If molding 30 is not used, leads 36 can still be formed for surface mounting. Further, leads 36 will typically be plated to provide a more easily attaching surface.

Thus, the practice of the present invention results in an increase of lead density for a given size die. Further, by the practice of the present invention multiple integrated circuits can be housed in a single package.

We claim:

1. An apparatus for housing an integrated circuit (IC), said IC being non-wettable by solder except for certain contact points disposed on the surface of said IC, said apparatus comprising:

a substrate having electrical contacts for mounting said IC onto its surface such that said contact points of said IC are solder bonded to said electrical contacts of said substrate in a self-aligned manner;

said substrate having patterned conductive lines disposed throughout to electrically couple said electrical contacts to terminals disposed around the peripheral edges of said substrate, said conductive lines being sufficiently narrow so as to permit increased lead density;

a lead frame having a plurality of leads, each lead having a first end coupled to said terminals around said peripheral edges of said substrate;

encapsulating means for encapsulating said IC, substrate, terminals and first ends of said leads, such that only other ends of said leads extend externally off said encapsulating means.

2. The apparatus of claim 1, further including a hermetic seal which is disposed on said substrate to enclose said IC prior to being encapsulating by said encapsulating means.

3. The apparatus of claim 2, wherein said terminal contacts of said IC are coupled to said electrical contacts of said substrate by solder bonding.

4. The apparatus of claim 2, wherein said first end of each of said leads is comprised of fingers, wherein said substrate is disposed between said fingers.

5. The apparatus of claim 1, wherein said terminal contacts of said IC are coupled to said electrical contacts of said substrate by solder bonding.

6. The apparatus of claim 1, wherein said first end of each of said leads is comprised of fingers, wherein said substrate is disposed between said fingers.

7. An integrated circuit package for housing an integrated circuit (IC), the surface of said IC being non-wettable by solder except for certain contact points disposed on the surface of said IC, said package comprising:
- a substrate having electrical contacts for mounting said IC onto its surface such that said contact points of said IC are solder bonded to said electrical contacts of said substrate in a self-aligned manner.
- said substrate having patterned conductive lines disposed throughout to electrically couple said electrical contacts to terminals disposed around the peripheral edges of said substrate, said lines being sufficiently narrow so as to permit increased lead density;
- said substrate having a sealed ring upon its surface, said sealed ring forming an enclosed perimeter around said IC;
- a lead frame having a plurality of leads each having a first end coupled to said terminals around said peripheral edges of said substrate;
- a hermetic lid disposed above said seal ring to completely encase said IC.

8. The package of claim 7, further including the encapsulating means for encapsulating said IC, substrate, terminals and first ends of said leads, such that only other ends of said leads extend externally off said encapsulating means.

9. The package of claim 8, wherein said seal ring is formed from a metallic material and said lid is formed from a ceramic material.

10. The package of claim 7, wherein said seal ring is formed from a metallic material and said lid is formed from a ceramic material.

11. A package for housing a plurality of integrated circuits (ICs), each having a surface which is non-wettable by solder except for certain contact points, said package comprising:
- a substrate having electrical contacts for mounting said IC onto its surface such that said contact points of said ICs are solder bonded to said electrical contacts of said substrate in a self-aligned manner;
- said substrate having patterned conductive lines disposed throughout to electrically couple said electrical contacts terminals disposed around the peripheral edges of said substrate, said connective lines being sufficiently narrow so as to permit increased lead density;
- a lead frame having a plurality of leads, each lead having a first end coupled to said terminals around said peripheral edges of said substrate;
- encapsulating means for encapsulating said IC, substrate, terminals and first ends of said leads, such that only other ends of said leads extend externally off said encapsulating means.

12. The apparatus of claim 11, further including a hermetic seal which is disposed on said substrate to enclose said ICs prior to being encapsulated by said encapsulating means.

13. A package for housing a plurality of integrated circuits (ICs) each of which has a surface which is non-wettable by solder except for certain contact points, said package comprising:
- a substrate having electrical contacts for mounting said ICs onto its surface such that said contact points of said IC are solder bonded to said electrical contacts of said substrate in a self-aligned manner;
- said substrate having patterned conductive lines and disposed throughout to electrically couple said electrical contacts to terminals disposed around the peripheral edges of said substrate, said patterned conductive lines being sufficiently narrow so as to permit increased lead density;
- a lead frame having a plurality of leads, each lead having a first end coupled to said terminals around said peripheral edges of said substrate;
- a hermetic lid disposed above said seal ring to completely encase said ICs.

14. The package of claim 13, further including encapsulating means for encapsulating said ICs, substrate, terminals and first ends of said leads, such that only other ends of said leads extend externally off said encapsulating means.

15. The package of claim 14, wherein said seal ring is formed from a metallic material and said lid is formed from a ceramic material.

16. The package of claim 13, wherein said seal ring is formed from a metallic material and said lid is formed from a ceramic material.

17. A method for packaging an integrated circuit wherein lead density is increased for a given size die of said integrated circuit (IC), the surface of said IC being non-wettable by solder except for certain contact points, said method comprising the steps of:
- solder bonding said IC onto the surface of substrate such that said contact points of said IC couples to electrical contacts disposed on said substrate in a self-aligned manner;
- said substrate having patterned conductive lines disposed throughout to couple said electrical contacts to terminals disposed around the peripheral edges of said substrate, said lines being sufficiently narrow so as to permit increased lead density;
- coupling one end of a plurality of leads of a lead frame to said terminals around said peripheral edges of said substrate; and
- enclosing said IC.

18. The method of claim 17, wherein the step of enclosing said IC comprises:
hermetically sealing said IC by forming a hermetic cover on said substrate over said IC.

19. The method of claim 17, wherein the step of enclosing said IC comprises encapsulating said IC, substrate, terminals and first end of said first plurality of leads, such that other ends of said leads remain external to the encapsulating material.

20. The method of claim 17, wherein the step of enclosing said IC comprises hermetically sealing said IC by forming a hermetic cover on said substrate over said IC, substrate, terminals and first end of said plurality of leads, such that other ends of said leads remain external to the encapsulating material.

* * * * *